US005723034A

United States Patent [19]
Ohmi

[11] Patent Number: 5,723,034
[45] Date of Patent: Mar. 3, 1998

[54] PROCESS FOR FORMING HYDROGENATED AMORPHOUS SILICON FILM

[75] Inventor: Kazuaki Ohmi, Yokohama, Japan

[73] Assignee: Canon Kabushiki Kaisha, Tokyo, Japan

[21] Appl. No.: 646,556

[22] Filed: May 8, 1996

Related U.S. Application Data

[63] Continuation of Ser. No. 337,457, Nov. 4, 1994, abandoned, which is a continuation of Ser. No. 102,980, Jul. 28, 1993, abandoned.

[30] Foreign Application Priority Data

Jul. 31, 1992 [JP] Japan .................................. 4-205537

[51] Int. Cl.$^6$ .................................................. C23C 14/34
[52] U.S. Cl. ........................... 204/192.23; 204/192.15; 204/192.26
[58] Field of Search .................... 204/192.12, 192.15, 204/192.23, 192.25, 192.26, 298.08

[56] References Cited

U.S. PATENT DOCUMENTS

| | | | |
|---|---|---|---|
| 4,353,788 | 10/1982 | Jeffrey et al. | 204/192.25 X |
| 4,496,450 | 1/1985 | Hitotsuyanagi et al. | 204/192.25 X |
| 4,824,546 | 4/1989 | Ohmi | 204/298.08 |
| 4,874,494 | 10/1989 | Ohmi | 204/298.06 X |

FOREIGN PATENT DOCUMENTS

| | | | |
|---|---|---|---|
| 0458991 | 12/1991 | European Pat. Off. | C30B 23/08 |
| 0470580 | 2/1992 | European Pat. Off. | H01J 37/32 |
| 52-16990 | 2/1977 | Japan | H01L 3/104 |
| 54-86341 | 7/1979 | Japan | G03G 5/08 |
| 63-50025 | 3/1988 | Japan | H01L 21/31 |
| 3-65013 | 10/1991 | Japan | H01L 21/3205 |

OTHER PUBLICATIONS

J. Non–Crystal Solids, 8–10, 739 (1972).
J. Electrochem. Soc., 166, 77 (1969).
Solid State Comm., 17, 1193 (1975).
App. Phys. Letters, 30, No. 11, 561 (1977).
J. Appl. Phys. 49, No. 12, 6192 (1978).
Solid State Comm., 20, 969 (1976).
AIP Conf. Proceedings, 73, 47 (1981).
Solar Energy Materials, 8, 187 (1982).
J. Vacuum Sci. Techn., 14, 92 (1972).
W.T. Pawlewicz, "Influence of Deposition Conditions on sputter–Deposited Amorphous Silicon", J. Appl. Phys., vol. 49, No. 11, Nov. 1978, pp. 5595–5601.
T. Ohmi et al., "Formation of Device–grade epitaxial silicon films at extremely low temperatures by low–energy bias sputtering", J. Appl. Phys. 66 (10), pp. 4526–4766 (1989).

*Primary Examiner*—Nam Nguyen
*Attorney, Agent, or Firm*—Fitzpatrick, Cella, Harper & Scinto

[57] ABSTRACT

A process for forming an hydrogenated amorphous silicon film by depositing an hydrogenated amorphous silicon hydride film onto a substrate by a high frequency sputtering comprises applying a DC or high frequency, bias voltage to at least one of a target composed of a material containing Si atom and a substrate with a discharge frequency of 50 MHz or more and using an inert gas containing hydrogen in a controlled amount of 0.1 atomic % or more as an electric discharge gas.

7 Claims, 2 Drawing Sheets

FIG.1

PROCESS FOR FORMING HYDROGENATED AMORPHOUS SILICON FILM

This application is a continuation of application Ser. No. 08/337,457, filed Nov. 4, 1994, now abandoned which is a continuation of application Ser. No. 08/102,980, filed Jul. 28, 1993, now abandoned.

BACKGROUND OF THE INVENTION

1. Field of the Invention

The present invention relates to a process for forming an amorphous silicon hydride a hydrogenated amorphous silicon film.

2. Related Background Art

Hydrogenated amorphous silicon (hereinafter, a-Si:H)-based semiconductors have been widely used in electronic devices such as electrophotographic photosensitive members, pickup tubes, solid pickup elements, display TFTs, solar cells, etc.

For deposition of amorphous semiconductors containing elements of the Group IV of the Periodic Table, such as amorphous Si (hereinafter, a-Si), a-SiGe, a-SiC, a-SiN, a-SiO, etc., various methods have been so far proposed. For example, a vacuum vapor deposition method [for example, Journal of Non-Crystalline Solids, Vol. 8–10, page 739 (1972)], a sputtering method, and various CVD methods such as a plasma CVD method, a photo CVD method, etc. Among them, a plasma CVD method for forming a film on a substrate by RF glow discharge decomposition of a starting gas for film formation such as an $SiH_4$ gas or the like with a high frequency of 13.56 MHz has been conventionally used on a wide scale, because good a-Si can be deposited. The method was initiated by R. C. Chittick et al. [Journal of Electrochemical Society, Vol. 166, page 77 (1969)], and has been regarded as promising since W. E. Spear et al. succeeded in pn control of electric conduction of amorphous semiconductors by impurities for the first time [Solid State Communications, Vol. 17, page 1193 (1975)], and there are many examples of its applications including a solar cell (JP-A-52-16990, etc.) and an electrophotographic photosensitive member (JP-A-54-86341, etc.). Various developments and improvement of the process have been made since then. For example, a method of using a semiconductor gas diluted with hydrogen or argon (At) and a higher frequency than RF, and a method of using an electron cyclotron resonance under an applied magnetic field have been proposed.

It was reported that the a-Si formed by a plasma CVD method contains a few to a few tens % of hydrogen [Applied Physics Letters, Vol. 30, No. 11, page 561 (1977)], and the amount of about 10 to about 20% of hydrogen contained in the deposited film has been presumed to be a cause for better characteristics (photoconductivity, controllability of electroconductivity by impurities, etc.) than those of pure a-Si. On the basis of this presumption various methods of supplying hydrogen at the same time while forming a film by other method have been proposed. For example, even the vacuum vapor deposition method could have a remarkable effect by supplying hydrogen during the film formation, [Journal of Applied Physics, Vol. 49, No. 12, page 6192 (1978)]. In the sputtering method of using an Ar plasma on Si, SiGe or other semiconductor target, a reactive sputtering method for depositing an amorphous film on a counterposed substrate by mixing an Ar gas as an electric discharge gas with a hydrogen gas and reacting with the element to be deposited while sputtering the crystal target by a high frequency plasma of 13.56 MHz was proposed [for example, Solid State Communications, Vol. 20, page 969 (1976)], where it was found that a better a-Si:H film with less dangling bonds could be deposited. The sputtering method is advantageous because it does not use an expensive, hard-to-handle, harmful semiconductor gas with less suitability for prolonged preservation. Thus, an expensive, large scale apparatus for removing harmful substances from effluent gases or auxiliary apparatuses such as a leak gas alarm system, a cylinder cabinet, etc. can be much simplified, resulting in cost reduction. As an improvement of the reactive sputtering method, a bias sputtering method of applying a bias to the substrate has been studied for the formation of an a-Si film, as reported by AIP Conference Proceedings, Vol. 73, page 47 (1981) and Solar Energy Materials, Vol. 8, page 187 (1982).

A-Si:H of somewhat good quality can be deposited by high frequency plasma CVD using, for example, an $SiH_4$ gas. However, since a reactive gas such as $SiH_4$, etc. is used in the conventional plasma CVD method, expensive apparatuses such as an apparatus for removing harmful substances from the effluent gas, a gas leakage-preventive unit, a leak gas alarm system, etc. are required. Furthermore, an expensive gas of high purity, which is less suitable for prolonged preservation, is necessary as a raw material gas. In addition, the utilization efficiency of the gas is usually as low as about 10% and the deposition rate of the film is low. These problems have been an obstacle to cost reduction. Furthermore, it is generally necessary for obtaining a good film quality that the deposition rate is lowered, and it is not so easy to obtain a higher deposition rate, a better film quality and a larger area at the same time. During the formation of an a-Si film, the a-Si film is deposited not only on the substrate, but is significantly deposited on other parts such as the inside wall of the film-forming chamber, the substrate holder, etc., and the deposited film is gradually peeled off the other parts and the peeled portions are mixed in the film on the substrate, thereby often deteriorating the device characteristics. To prevent the peeling, it is necessary to remove the unwanted a-Si film deposited on the interior of the chamber periodically. The necessity for such a frequent removal has been an obstacle to an improvement in working efficiency of the film forming apparatus.

On the other hand, the reactive sputtering method of using an electric discharge gas such an argon gas mixed with a hydrogen gas and a high frequency plasma of 13.56 MHz does not require an expensive, harmful gas, and thus an apparatus for removing harmful substances from the effluent gas, a leak gas alarm system, etc. are not required at all, or at least can be made considerably smaller in scale. Therefore, the reactive sputtering method is very effective for cost reduction. Also, an a-Si film has a higher electrical resistance than the crystalline Si film, and thus deposition can be carried out by a high frequency plasma. Since the film deposition on the inside walls of the film-forming chamber is relatively small, maintenance of the chamber is easier to perform. In spite of these advantages, damage to the film due to $Ar^+$ ion bombardment and the intrusion of Ar gas into the film have been encountered. Furthermore, the film is changed into a columnar structure, and a uniform, compact film has been hard to obtain. Therefore, the a-Si film obtained by the conventional reactive sputtering method has had such inconvenient disadvantages, when a-Si films are used in devices, as a relatively high spin density, a low electroconductivity ($\sigma_p$) under light irradiation, a low carrier mobility, a low impurity doping efficiency, a high tendency that the deposited film forms a columnar uneven structure in the film growth direction, inclusion of a few % of Ar gas in the film, etc., as compared with the film formed by the plasma CVD method. Differences in the characteristics of a-Si between the reactive sputtering method and the plasma CVD method have been disclosed in, for example, Japanese Journal of Applied Physics, Vol. 19, Supplement 19-1, page 521 (1980), etc.

The causes for the problems have not been fully clarified yet, but seem to be due to the following facts. There is an influence in the damage to the deposited film due to ions from the plasma on the target hitting the film surface growing on the substrate counterposed to the target. In case of sputtering, it is an ordinary practice to use an electrically discharged plasma of an inert gas having a relatively large molecular weight such as Ar, etc. to enhance the sputtering yield of a target. The plasma can be generated by DC electric discharge, AC electric discharge, high frequency electric discharge or the like, where the high frequency electric discharge is suitable for materials of high resistance such as a-Si, etc. Ions such as $Ar^+$, etc. in high frequency plasma are accelerated by self bias applied onto the target or by externally applied target bias to hit the target, thereby sputtering out target atoms. However, the ions also hit the growing film surface and damage the deposited film. This seems to be due to a potential difference between the plasma and the growing film surface, i.e., the so called sheath voltage. That is, the positive ions such as $Ar^+$, etc. are accelerated in the substrate direction due to the potential difference to damage the deposited film on the substrate. A method for controlling the substrate bias is known to reduce such damage. As is disclosed, for example, in the Journal of Vacuum Science and Technology, Vol. 14, page 92 (1977); AIP Conference Proceedings, Vol. 73, page 47 (1981); Solar Energy Materials, Vol. 8, page 187 (1982), etc., there have attempts to control the energy of ions striking the growing film surface from the plasma by applying a bias voltage to the substrate. For example, characteristics of an a-Si:H film deposited on a substrate by high frequency electric discharge (13.56 MHz) of an Ar gas containing hydrogen, using a target of polycrystalline Si, etc. are influenced by a substrate bias. For example, in the film formed by application of positive substrate bias, hydrogen in the film forms an SiH bond characterized by infrared absorption spectrum at about 2,000 cm$^{-1}$. Such a film often has considerably better characteristics, e.g. higher $\sigma_p$, etc. in case of the GD method, but has not always better characteristics in case of the sputtering method, that is, an uneven film having unsatisfactory characteristics, such as columnar structure, can be sometimes formed.

When the substrate bias is negative or when the substrate floats, then by applying a negative self-bias to the substrate, film formation is carried out and bonds such as $SiH_2$, $(SiH_2)n$, etc. characterized by infrared absorption spectrum at about 2,100 cm$^{-1}$ are increased mainly as bond forms of hydrogen in the deposited film. At this time, the film undergo ion damage. Therefore, there is a risk of deterioration of film characteristics. On the other hand, it is reported that the columnar structure is hardly formed and the uniformity of the film is not always deteriorated. Furthermore, the negative bias is disadvantageous because the Ar atoms are liable to be taken into the film. One of the reasons seems to be due to bombardment of $Ar^+$ ions into the film. Increase in the concentration of Ar atoms in the deposited film due to bombardment of $Ar^+$ ions into the deposited film and the resulting incorporation of $Ar^+$ ions in the film has a negative effect on the improvement of film characteristics. As described above, at least one of the effects of substrate bias seems to be due to actions of $Ar^+$ ions hitting the growing film surface during the film deposition and also due to the electrons hitting the substrate, but its mechanism has not been fully clarified yet, and in the current situations control of film quality has not been fully accomplished. Another reason seems to be a considerable spreading of energy distribution of ion's in the plasma due to acceleration of $Ar^+$ ions, etc. in the plasma under the AC field of high frequency. At the conventionally employed high frequency of about 13.56 MHz, $Ar^+$ ions or $Ne^+$ ions can barely follow changes in the electric field, resulting in their acceleration. That is, the ions can have a considerable initial speed. Thus, even if the sheath voltage is 0 V as a DC component, high energy level ions hit the surface of deposited film. Therefore, it is not easy to completely prevent ion damage of the deposited film by control of substrate bias.

Furthermore, the surface mobility of Si atoms during the film deposition is another problem. When deposition of a-Si is carried out by a reactive sputtering method using an inert gas and a hydrogen gas, it is known that most of the Si hitting the substrate from a target by sputtering are Si atoms and such ions as $Si^+$, etc. and also radicals of $SiH_4$, etc. or their ions. These Si atom, ions and radicals are more chemically reactive than $SiH_3$ which is the main reaction precursor when conducting the RF plasma CVD method using $SiH_4$. Thus, when these active species of high reactivity reach the substrate surface at a relatively low temperature, as they are, the active species undergo reaction instantaneously as they are, resulting in film deposition without any process of structural relaxing such as surface transfer, etc. Therefore, the deposited film seems to have many structural defects. This problem is not so serious in case of Al, Cu, Ti or other metals because of weak bond orientation or because characteristics are hardly influenced by structural changes, whereas this problem is very important in deposition of a film of semiconductor material such as a-Si, etc. which has a high covalent bondability, a distinct bond orientation and such a structure as to be adversely influenced in characteristics. Particularly, a-Si is a semiconductor capable of performing pn control of electroconductance by impurities among the amorphous materials. The better the film quality, the higher the structural sensitivity of the characteristics. Thus, a-Si is highly susceptible not only to ion damage, but also to a decrease in the surface mobility of Si atoms, H atoms, etc. resulting in a decrease in $\sigma_p$, doping efficiency of pn control of the electroconductivity by doping of impurities, or in deterioration of the uniformity of the deposited film. That is, it is important to semiconductor materials such as a-Si, a-Si alloy, etc., as compared to metallic materials, to promote the surface mobility of deposited atoms while suppressing the ion damage of deposited film. When an a-Si film of good quality is deposited by a sputtering method, it is effective to promote the surface transfer of reaction precursor on the growing film surface and also promote structural relaxation during the film deposition, as mentioned above, by some means. In the conventional plasma CVD method or reactive sputtering method it seems that the promotion can be attained to some extent by inactivation of the growing film surface by hydrogen. A corresponding effect can be expected by the inactivation of the growing film surface by hydrogen, but the reactivity of reactive species reaching the growing film surface is so high that the surface is etched, thereby roughening the surface or hydrogen is so much taken into the growing film that film quality such as $SiH_2$ bond, etc. is deteriorated or the film compactness is lowered. That is, no satisfactory effect can be obtained simply by supplying a large amount of hydrogen. Control of the amount of hydrogen has been studied in the reactive sputtering method, for example, by control of hydrogen gas partial pressure, but it has been found difficult to obtain an a-Si film of good quality only by such hydrogen gas control. It is also possible to promote the surface mobility of Si atoms also by elevating the substrate temperature. When the substrate temperature is too much elevated, for example, to about 350° C. or higher, H atoms that are absorbed on the film surface and help to maintain the surface mobility start to be desorbed, resulting in deterioration of the surface transfer of Si atoms to the contrary. Furthermore, when the substrate temperature is too high, the H concentration of the film will decrease, thereby increasing dangling bonds. Therefore, the film characteristics are rather deteriorated. Thus, the elevation of a substrate temperature has a limit.

Furthermore, it has been attempted to form a dense structure by bombarding the growing film surface with ions in a plasma. There is a report that columnar structures, which are often observed in the sputtering method, by ion irradiation under a negative substrate bias during the film deposition are not formed and the film quality can be improved thereby [Solar Energy Materials, Vol. 8, page 187 (1982)]. However, application of the bias sometimes lowers the film quality and also its control are not so simple. One of the reasons seems to be due to film damage by the ions.

In case of deposition of a metal, a method for lowering the frequency of high frequency bias applied to the substrate, thereby broadening the ion energy distribution and reducing the unevenness of the deposited film surface is disclosed in Japanese Patent Publication No. 3-65013, etc., where it is proposed to irradiate a substrate with ions having a broad ion energy distribution with a plasma at a frequency of 5 kHz to 1 MHz on the basis of the above-mentioned phenomena, thereby enhancing the surface mobility of atoms in the deposited film and flattening the deposited film. The desired effect is to flatten the deposited film surface and similar effects can be qualitatively expected also in case of Si, if the reduction of frequency can have such an effect. However, the deposited flat a-Si film has simply a surface flatness, and practically important semiconductor characteristics such as pn control of electroconductivity, photoconductivity, etc. are not expected at all. In case of forming a film of semiconductor material such as Si, structural sensitivity of the characteristics is so high that the characteritics are highly influenced by ion damage, as compared with a metallic film.

In the conventional reactive sputtering method, as described above, no satisfactory surface transfer or surface diffusion of Si atoms takes place on the growing film surface to such a degree as to deposit an a-Si film that is throughly structurally relaxed and has less defects. Therefore, the deposited film is not dense and is liable to have a columnar structure, and it is hard to deposit a film of good quality. When the ion irradiation is promoted to collapse such a columnar structure, uneven structures such as the columnar structures can be reduced, but the deposited film undergoes ion damage, thereby readily deteriorating the characteristics. Thus, there is a problem in reproductibity of characteristics of the formed film and stability of film forming process. Accordingly, it is not easy to deposit an a-Si by the conventional reactive sputtering method and to use the film in electronic devices even with simultaneous application of a substrate bias in the film deposition from materials having a high covalent bondability such as Si. For depositing a-Si for use in the production of electronic devices, a plasma CVD method or its improved method has been so far employed.

SUMMARY OF THE INVENTION

An object of the present invention is to provide a process for depositing an amorphous semiconductor of good quality safely at a low cost and with a good reproducibility, while taking advantage of the conventional reactive sputtering method as described above, an amorphous semiconductor and eliminating disadvantages thereof.

Another object of the present invention is to provide a process for stably obtaining hydrogenated a-Si film of good quality with a very low Ar concentration.

Still another object of the present invention is to provide a process for obtaining an a-Si film having a high doping efficiency on pn control of electroconductance by impurity doping and a high electroconductivity $\sigma_p$ under light irradiation.

DETAILED DESCRIPTION OF THE PREFERRED EMBODIMENTS

The preferred embodiment of a process for forming an hydrogenated amorphous silicon film according to the present invention will be explained below.

The process of the present invention for forming an hydrogenated amorphous silicon film by depositing the hydrogenated amorphous silicon film onto a substrate by a high frequency sputtering method comprises applying a DC or high frequency bias voltage to at least one of a target composed of a material containing Si atom and a substrate with a discharge frequency of 50 MHz or more and using an inert gas containing hydrogen in a controlled amount of 0.1 atomic % or more as an electric discharge gas.

As a result of extensive studies to obtain a hydrogenated a-Si of good quality by further improving the controllability of charged particles, as mentioned above, thereby taking advantage of the above-mentioned reactive sputtering method, the present inventor has found that a-Si of very good quality can be obtained by the reactive sputtering method by applying a bias to at least one of a substrate and a target with an increased discharge frequency and by precisely controlling the bias. An a-Si film of good quality, which cannot be obtained by the conventional reactive sputtering method, can be formed with a good reproducibility thereby.

The present invention will be described in detail below, referring an apparatus for use in the present invention.

The film forming apparatus for embodying the present invention is an apparatus having a vacuum chamber capable of placing therein a target consisting mainly of materials to be deposited and a substrate on which a-Si is to be deposited. Its form of arrangement is not necessarily a parallel arrangement of two plates, as often seen in the conventional high frequency sputtering method. The form of arrangement can be a structure as shown, for example, in FIG. 1. The vacuum chamber 1 is evacuated to about $10^{-5}$ Torr or less or preferably $10^{-7}$ Torr or less without any gas passage by vacuum pumps 3 and 4. Then, an Ar gas stored in a gas cylinder 16 is introduced into the vacuum chamber 1 through a gas purification unit 15 and a mass flow controller 18. A hydrogen gas stored in a gas cylinder 20 is introduced into the vacuum chamber 1 through a gas purification unit 19 and a mass flow controller 22. The Ar gas mixed together with the hydrogen gas may be introduced into the vacuum chamber 1. It is necessary that a ratio of hydrogen to Ar is at least 0.1 atomic %. When no hydrogen is contained, photoelectric characteristics of a-Si will be unsatisfactory, and such a-Si is not suitable to ordinary applications, for example, to image sensors and solar cells. A target 8 is composed of materials to be deposited such as Si, etc. and is exposed to a high frequency plasma of an inert gas such as Ar, etc. Plasma can be generated in the chamber 1 by applying a high frequency of 50 MHz or more from a high frequency oscillator 12 to the target or target holder. In the apparatus shown in FIG. 1, numeral 11 denotes a matching box; numeral 14, a D.C. bias power source; numeral 13, a low-pass filter; numeral 10, a capacitor; numeral 9, a magnet; and numeral 6, a susceptor for placing a substrate 5 thereon. The means for plasma generation may not always be of a capacity coupling type, such as an apparatus shown in FIG. 1. For example, an induction coupling type for applying a high frequency to a coil may be used. In that case, it is necessary that the position of the target is located near the plasma and the target bias is indispensable. Ions generated in the plasma are accelerated by the self-bias of the target or by the target bias externally applied through a low frequency transmission filter and strike the targets to sputter out the target material. The target bias has an advantage of independent controllability by the external application as mentioned above to some extent from the charged high frequency power and is highly effective particularly for the improvement of deposition rate. Sputtered-out target material from the target by ions from the plasma is distributed over the substrate surface placed in the vacuum chamber and deposits on the substrate. During the deposition, a DC or high frequency bias is applied to the substrate to control the energy of ions hitting the surface on which the film is deposited to an optimum. At that time, at least a portion of hydrogen mixed in the discharge gas reacts with the ions and is taken into the deposited film. The target material distributed over the substrate deposits onto the substrate through amorphorization by properly selecting the crystallinity and temperature of the substrate, a substrate bias, an atmospheric gas, a substrate surface state, etc. Some of these steps for amorphorization have been so far known quantitatively, and these steps are utilized in the present invention, thereby depositing a-Si of good quality.

Figure 2:
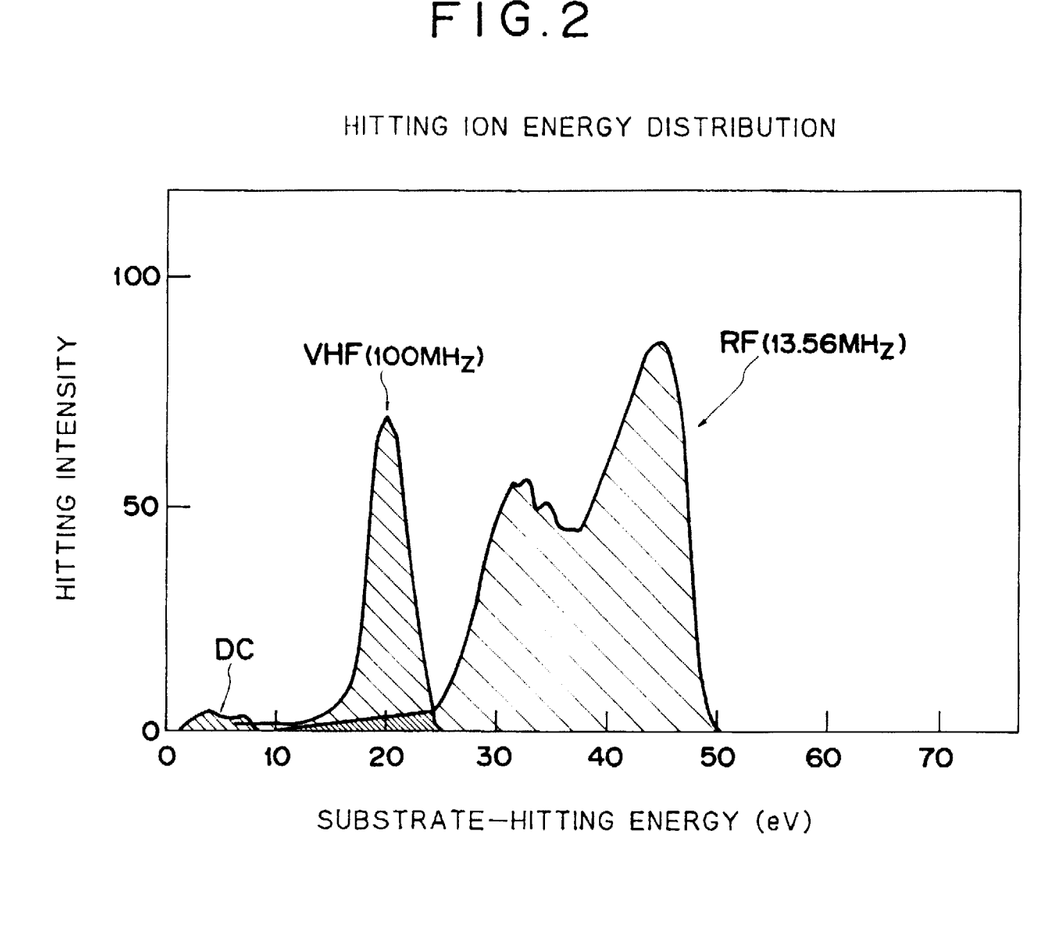
FIG. 2 is a diagram showing distribution of incident ion energy onto a substrate.

One of aims of the present invention is to deposit an a-Si film of good quality with a good reproducibility by the sputtering method having various advantages, as mentioned above, through simultaneous realization of improvement of the surface mobility of atoms and reduction of ion damage of the deposited film during the film formation, and improvement of the surface mobility and reduction of ion damage are not compatible in the conventional sputtering method. One of important points for the simultaneous realization is to make the discharge frequency higher than the usually employed one, i.e., 13.56 MHz. By making the discharge frequency 50 MHz or higher, desirably about 100 MHz or higher, the energy distribution of ions hitting the substrate will be sharp, as shown in FIG. 2, and its peak will largely shift towards the lower energy side. Thus, it has been possible, for the first time to precisely control the energy of ions hitting the substrate by bias control of a substrate or a target. When ion irradiation onto the growing film surface is conducted by controlling the bias of a substrate and/or a target during the film formation, the surface transfer of atoms ejected from the target can be promoted on the growing film surface, as compared with the case without ion irradiation, and thus not only the surface unevenness can be reduced, but also dangling bonds and other structure defects in the film can be reduced, thereby improving the semiconductor characteristics of the film. Detail of the mechanism of the effects obtained by the ion irradiation have not been clarified yet, but it seems that the ion irradiation has such effects that ions give a momentum to film-forming atoms on the growing film surface or energy to the atoms on the growing film surface or ion irradiation elevates the temperature of the growing film surface. When too large a positive substrate bias is applied, a less compact film containing columnar structures will be deposited and the electroconductivity under light irradiation will be lowered, resulting in deterioration of the film quality. This seems to be due to insufficient ion energy and the resulting insatisfactory surface mobility of Si atoms on the growing film surface. Even if too large a negative bias is applied on the other hand, the film quality will be also lowered. This seems to be due to excessive ion energy and the resulting damaging of deposited a-Si film by ion bombardment. Accordingly, it is necessary to control the ion irradiation energy to a constant optimum level, that is, not too high or low an energy level. In the frequency range of 50 MHz or more, the ion energy distribution in the plasma is narrow, so that the energy level of ions hitting the substrate surface substantially depends upon a substrate bias and a plasma potential. The plasma potential is influenced not only by a discharge pressure or a discharge power level, but also by a target bias. Thus, it is necessary to control all of these factors. Such control is possible. Through such control, necessary and sufficient energy can be given to discharge gas ions, for example, $Ar^+$ ions to effect irradiation of the growing a-Si film surface. This effect can be clearly pronounced in the sputtering method using a low discharge pressure of about $10^{-4}$ to about $10^{-2}$ Torr, whereas in the RF plasma CVD method using a discharge pressure of $10^{-2}$ to 1.0 Torr the effect is relatively small. The plasma potential changes, depending upon a target bias, a discharge frequency, a discharge power level, a discharge pressure, a discharge gas species, a mixing ratio of hydrogen, a substrate temperature, a shape of film-forming chamber, a shape (particularly area ratio) of a target and other factors, and thus it is hard to set the optimum value of substrate bias simply by voltage, but it is often appropriate that the optimum substrate bias is −10 V to +30 V. The width of the optimum value is narrow, and is not more than ± about 10 V from the center value. Quality of the growing a-Si film is sensitive to a substrate bias, and under constant discharge conditions a change on the order of 1 V is sufficiently effective for the film quality control. More specific conditions are disclosed in the Examples which follow. In case of the conventional 13.56 MHz, only a slight change can be obtained in the film quality by the bias control, and control of a few 10 V to 100 V is required for the control of the film quality, and even under such a higher bias the film quality is not so improved, and rather the film is sometimes damaged by ions of high energy level impacting the substrate. Thus, it is hard to precisely control the film quality with a good reproducibility by the conventional reactive sputtering method. Most essential incident energy of ions onto the substrates surface can be determined by placing an ion energy analyzer at a position at which a substrate is to be placed and measuring an ion energy level under the same conditions as those for forming a film. Simultaneous monitoring of ion energy during the film forming is not simple, but the optimum ion energy level is in a range of approximately a few eV to a few ten eV, and depends upon a-Si or various a-Si alloys and also upon a substrate temperature. More specifically, an optimum bias value under specific conditions can be obtained by evaluating the quality of the formed a-Si film. In any case, it is necessary to give a necessary and sufficient ion energy level, that is, not too high or low an ion energy level. When a discharge frequency of 50 MHz or more is used and when other plasma conditions are optimized, the absolute value of self-bias of an insulated substrate can be made smaller, thereby lowering the average ion energy level, and thus the incident ion energy can be made smaller even on a floated substrate. Thus, a-Si having good characteristics can be obtained in the present invention.

Another basic point of the present invention is an amorphorization. By amorphorization various characteristics not seen in crystals, such as stronger light absorption than that of crystals, more isotropic, homogeneous film quality than that of crystals, a distinguished controllability that allows a physical properties to continuously change by mixing a plurality of elements in a desired ratio, a broad range of film width of films uniformly formed on substrates of various material without any restriction to the lattice constant, a low temperature process capable of depositing film not only on a glass substrate of low melting point, but also on a metallic substrate at a temperature not causing a problem of metal diffusion, can be obtained. Various procedures have been proposed for the amorphorization. For example, according to a high frequency bias sputtering method proposed in Journal of Applied Physics, Vol. 66, No. 10, page 4756 (1989), amorphorization is carried out by shifting the substrate bias to the negative side. However, an influence of ion damage is pronounced under such conditions such that the growing film surface is strongly bombarded by ions in the substantial absence of hydrogen, and thus the proposed method is not suitable for the deposition of an a-Si film of good quality. The proposed method can be employed in the present process for depositing a hydrogenated a-Si film, and an amorphorization zone can be made available by shifting the substrate bias towards the negative side. This means control of ion irradiation energy during the film deposition. In other words, crystal lattices are broken by ion bombardment, but ion damage on the film is too strong to obtain a good film quality. Thus, the procedure of making the substrate bias negative is not used in a process for making an a-Si film of good quality. When the substrate temperature is increased, the film quality can be improved to some extent. In case of using Si monocrystal or polycrystal as a substrate, Si crystal grows by making the substrate temperature too high, and thus there is an upper limit to the substrate temperature. An a-Si film can be deposited by lowering the substrate temperature, and by maintaining the substrate bias approximately at zero V or at a positive side so as not to cause ion damage. These procedures alone may increase the surface unevenness and thus cannot always form a film of good quality. By increasing the ion energy through substrate bias control at that time, the film quality can be improved. As a further improvement, a thin a-Si layer with many defects can be formed at first on an Si crystal at a higher ion energy level or at a lower substrate temperature or both at a higher ion energy level and a lower substrate temperature, and then an a-Si film of good quality can be formed thereon with lower ion energy and at a higher substrate temperature. The substrate temperature is desirably about 150° C. to about 450° C. depending on ion energy in film deposition. When the surface of Si crystal substrate is fluorinated by exposing it to a plasma of a fluorine-containing gas such as $CF_4$, $SiF_4$, $F_2$, HF, etc., or its diluted gas, or by a wet process, an a-Si film can be deposited thereon at a higher substrate temperature or a lower ion energy level. An amorphous material such as quartz, glass, polyamide, polycarbonate, etc. as a substrate can be used, and growth of Si crystal can be suppressed even under such conditions as a higher substrate temperature and an appropriately lower ion energy level, and an a-Si film of good quality can be deposited. Polycrystalline Si sometimes grows at too high a substrate temperature. Actual conditions will be described in the Examples which follows. Crystals having different lattice constants from that of Si can be used, and not only monocrystals, but also polycrystals can be used. Semiconductor materials such as GaAs, ZnS, etc., insulating materials such as MgO, alumina, BN, diamond, etc., electroconductive materials such as graphite, Al, Ni, Cr, stainless steel and other metals, and other well known crystalline materials can be used. Furthermore, an a-Si film can be deposited by increasing a concentration of hydrogen to be added to Ar, where a-Si can be deposited at a considerably high substrate temperature and at a rather low ion energy level, but the hydrogen concentration of the deposited a-Si film is sometimes considerably high.

As described above, there are various procedures for amorphorization, and a suitable procedure can be selected for the desired purpose. In any procedure, precise control of ion irradiation energy during the film deposition is important, and thus an a-Si film with good characteristics can be deposited only when such a procedure for amorphorization is combined with a high frequency bias sputtering method, as in the present invention.

When an a-Si film is deposited according to the present process, a good film with less impurities can be deposited if the pressure of gases other than Ar and hydrogen in the discharge gas, for example, $H_2O$, $N_2$, $O_2$, $CO_2$, etc. is low. These other gases are taken into the deposited film not only to cause defects, but also to give a possibility to inhibit the surface transfer of deposited atoms during the film deposition, and thus are undesirable. Thus, the so called back pressure of the film-forming chamber must be $10^{-6}$ Torr or less, preferably $10^{-7}$ Torr or less. Particularly to order to attain the effect of promoting the surface mobility of atoms by ion irradiation, which is the specific feature of the present invention, a back pressure must be $10^{-8}$ Torr or less. It is also desirable to use an Ar gas, a hydrogen gas, etc. having a high purity for the film formation. The gases can be passed through a gas purification unit before introduction into the film-forming chamber, or various procedures known in the semiconductor field such as a passivation treatment of stainless steel (SUS) pipe inside can be employed to prevent gas contamination within the gas piping.

A discharge gas for the film formation by sputtering includes inert gases such as He, Ne, Ar, Xe, Kr, etc. which can be employed in the same manner as in the ordinary sputtering method. At a frequency of 50 MHz or more, particularly 100 MHz or more, there is no extremely large difference in the spreading of ion energy distribution among the inert gases having different atomic weights excluding He in contrast to 13.56 MHz. In case of He, the energy distribution has a little broader spreading, but ion damage is less. Thus, these gases can be selected, as desired. A mixture of at least two of these gases can be used, if desired.

A discharge pressure is appropriately in a range of a few mTorr to a few 10 mTorr for ordinary purposes but is not always limited to this range. When a ratio of inert element ion gas to substrate-striking Si atoms is too low during the film deposition, the effect of promoting the surface transfer of Si atoms by ions will be unsatisfactory and the structure relaxing will not proceed well, resulting in deterioration of film quality. In case of Ar, an atomic ratio of Ar/Si must be about 0.1 or more. This ratio can be controlled by the target bias, the substrate bias, the discharge power, the discharge pressure, etc.

Optimum partial pressure of hydrogen to be added to the inert gas depends upon conditions and is not set independently, but the partial pressure of hydrogen can be roughly a few mTorr or less, and a good effect can be obtained under about 1 mTorr or less. An Ar gas containing a controlled amount of hydrogen can be introduced into the film-forming chamber for depositing a film, or a hydrogen gas and an Ar gas can be separately introduced into the film-forming chamber under their flow rate control and mixed together in the film-forming chamber.

Dangling bonds can be decreased by the hydrogen gas. A ratio of hydrogen atoms to Ar atoms must be at least 0.1 atomic %. At less than 0.1 atomic %, no appreciable effect of hydrogen addition can be obtained. Hydrogen is taken into the deposited a-Si film. It is not appropriate to use the hydrogen existing as an impurity in the discharge gas or as a residual and contaminant gas in the film-forming chamber, because of its low controllability of a-Si characteristics. Hydrogen has a strong influence on the a-Si characteristics, and thus it is necessary to introduce hydrogen under strict control. The amount of Ar or hydrogen can be controlled by a simple flow rate meter, but a mass flow controller, etc. that can control a flowing mass is desirable. So long as control of the amount can be made, any control procedure can be employed. The ratio of hydrogen to Ar can be changed during the film formation, if desired. The control procedure well known in the conventional sputtering method, plasma CVD method, etc. can be used as such or upon proper modification as the control procedure. As the hydrogen, hydrogen isotopes such as deuterium, tritium, etc. can be used besides the hydrogen having an atomic weight of about 1.0, which exists in the largest amount. Hydrogen is not required for the growth of the crystalline Si, where the presence of hydrogen sometimes rather produces crystal defects. Thus, the hydrogen addition has a particularly distinguished effect in case of a-Si deposition.

In case of a-Si deposition, polycrystalline Si and monocrystal Si having a high purity can be used as target materials. These materials are commercially and readily available. If particularly desired, a target, once amorphorized, may be employed. It is preferable to use a target of high purity, but targets containing specific impurities for electroconductivity control, for example, electroconductivity-controllable impurities including the Group IIIb elements such as P, As, Sb, etc. and the Group Vb elements such as B, Al, Ga, etc. or Li, Bi, etc. can be also used as target materials. Such impurities contained in the target are taken into the deposited film in a considerably high ratio, whereby an n-type or p-type film can be formed. Hydrogen or an inert gas element such as Ar, etc. may be contained in the target, but is usually supplied as a gas into the film-forming chamber, because better controllability can be obtained.

In case of forming films of a-SiGe, a-SiC, a-SiSn, a-SiN, a-SiO, etc., alloy targets of SiGe, SiC, SiSn, SiN, SiO, etc. can be used. Concentration ratios of these impurities or alloy elements can be controlled by selecting concentration ratios of targets. Individual targets of Si and Ge, Si and graphite, Si and Sn, etc. can be used at the same time. When an a-SiGe film is deposited by a reactive sputtering method, as in the present invention, such an expensive, highly explosive gas as $GeH_4$ is not used in contrast to the plasma CVD method, and thus not only the cost reduction of raw materials, but also simplification of gas supply piping, gas leak alarm system, effluent gas treatment system, etc. can be attained as advantages. When one of constituent elements can be supplied as a gas in case of a-SiN, a-SiO, etc., the constituent element gas can be added to Ar in the same manner as hydrogen, and the film can be deposited only with an Si target. Various procedures so far employed in the conventional sputtering method can be all employed for these purposes.

Bias control of the target and substrate can be carried out by DC bias application, but when the substrate is high in resistance, bias control of substrate surface is hard to control. Depending upon target materials, for example, SiC, etc., bias control is difficult to attain, because the film to be deposited is high in resistance. When a-Si itself is at a low impurity concentration, it has a considerably high resistance, and bias control of the substrate surface is sometimes hard to conduct only by simple DC bias application. In that case, the conventional procedure of applying a high frequency to the substrate and conducting bias control by self-bias at that time can be used (JP-A-63-50025), where control of self-bias can be carried out by controlling input power of the high frequency onto the substrate. A procedure of sufficiently increasing the discharge frequency to be applied to the target, thereby making the self-bias of the insulating substrate smaller can be also used. DC bias can be applied not only to the substrate, but also to the target. Deposition rate can be increased by applying a negative DC bias to the target, whereby a deposition rate of a few Å/sec. to a few 10Å/sec. can be obtained, which is much larger than the deposition rate obtained by the ordinary plasma CVD method.

Substrate materials for use in the present invention include monocrystal Si, polycrystalline Si, a-Si, or Si-containing compounds. In case of photoresistant materials such as $SiO_2$ and additive-containing glass, a substrate bias is hard establish, and thus the self-bias will be too high, depending upon discharge conditions or balance of arrangement in the film-forming chamber, thereby often obtaining no film of good quality. In that case, the film quality can be improved by the above-mentioned two-frequency excitation. In addition, metals such as Al, stainless steel, etc., transparent conductors such as ITO, and organic polymers such as polycarbonate, polyurethane, polystyrene, polyimide, etc. can be usually employed as substrate materials. In the actual application of substrate materials having a high resistance, it is necessary to limit the self-bias to a desirable range by some means. In the present invention, the self-bias can be kept at a practical level range, for example, about +5 to about +20 V by using a discharge frequency of 50 MHz or more, preferably 100 MHz or more.

A procedure of providing a magnet or a coil in close proximity to the target, forming a magnetic field in the plasma, thereby enhancing the plasma density and improving the deposition rate is very effective also for the present invention, as in the conventional sputtering method. For example, a magnet can be provided on the back side of the target to enhance the plasma density, as often carried out in the conventional sputtering method. A procedure of cooling the target, a procedure of maintaining the target, etc., as employed in the conventional sputtering method, can be also employed in the present invention.

Figure 1:
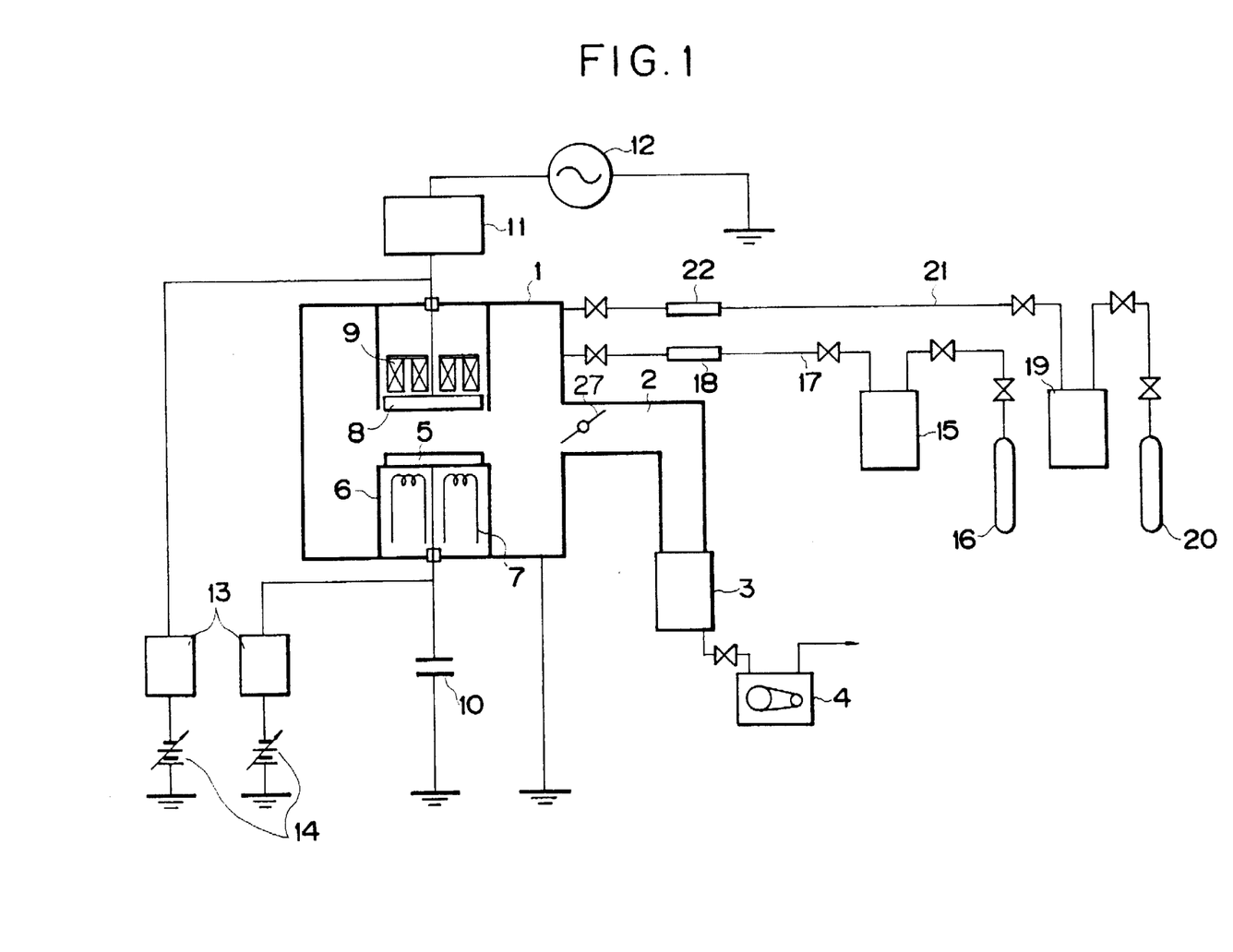
FIG. 1 is a schematic structure view showing one example of an apparatus for carrying out the process of the present invention.

FIG. 1 is a schematic view showing one example of an apparatus for use in the present invention. A vacuum chamber 1 for conducting film formation is evacuated to vacuum by an evacuation unit comprising a turbo molecular pump 3 and a rotary pump 4 through an evacuation duct 2. In the vacuum chamber 1, a substrate susceptor 6 and a parallel plate type, high frequency electrode integrated with a target susceptor are provided to generate high frequency plasma therein by capacity coupling. A target 8 is connected to a high frequency oscillator 12 through a matching box 11 to apply a high frequency to the target 8. The high frequency oscillator 12 must emit a frequency of 50 MHz or more, preferably 100 MHz or more. The target 8 is connected to a DC bias power source 14 through a low-pass filter 13. Magnets 9 are provided on the back side of the target 8, whereby the plasma density can be enhanced. The substrate susceptor 6 is also connected to another DC bias power source 14 through another low-pass filter 13. The bias applicator to the substrate 5 may be not a DC power source, but a high frequency power source. The substrate to be subjected to film deposition is placed on the susceptor 6, and can be heated by substrate heaters 7. An Ar gas of high purity can be introduced into the chamber 1 from an Ar gas cylinder 16 through a gas piping 17 and a gas purification unit 15, and its amount can be controlled by a mass flow controller 18 provided in the gas piping 17. Likewise, a hydrogen gas can be supplied to the chamber 1 from a hydrogen gas cylinder 20 through a gas piping 21 and a gas purification unit 19.

The present invention will be explained in detail below, referring to Examples.

EXAMPLE 1

An a-Si film was formed in an apparatus shown in FIG. 1, using a monocrystal FZ Si wafer having a diameter of 120 mm, a thickness of 1 mm and a volume resistivity of 1,500 $\Omega$cm as a target, and a mixed gas of Ar and hydrogen having an $H_2O$ dew point of $-99.6°$ C. or less as an electric discharge gas. Since the electric resistance of the target was so high that a target bias was hard to obtain, the back side of the target was subjected to B ion implantation by an ion implantation unit in advance to obtain an ohmic contact with a bias electrode. An Si wafer with an oxide films having a thickness of 400Å formed on the surfaces by heat oxidation was used as a substrate. The substrate was fixed onto a substrate susceptor in a film-forming chamber, and the film-forming chamber was evacuated to a vacuum of $10^{-9}$ Torr or less and then heated to a substrate surface temperature of 300° C. by a heater in the susceptor. Then, only Ar was passed into the film-forming chamber to set the internal pressure to 15 mTorr, and electric discharge was carried out with an electric discharge power of 5 W under a target bias of $-5$ V, a substrate bias of $+5$ V to clean the substrate surface by ion bombardment. The discharge frequency was 100 MHz. Then, a mixed gas of Ar and hydrogen was continuously passed into the film-forming chamber without breaking the vacuum to deposit a-Si on the cleaned substrate at a substrate temperature of 300° C. The discharge frequency was set to 100 MHz, the target bias to $-300$ V, the substrate bias to $+20$ V, and the discharge power to 100 W. The discharge pressure of the mixed gas of Ar and hydrogen was set to 15 mTorr and the hydrogen partial pressure to 0.1 mTorr. The film was deposited onto the Si substrate at a deposition rate of about 5Å/sec in this apparatus. X-ray diffraction analysis of the thus obtained deposited film showed a halo pattern and neither ring pattern nor spot pattern of crystal was observed at all. From this fact it was confirmed that the deposited film was in an amorphous structure.

The hydrogen concentration of the deposited film by infrared absorption spectrum analysis was revealed to be about 5.2 atomic % without any absorption due to $SiH_2$ or $SiH_3$ bond at about 2090 to about 2150 $cm^{-1}$ at all. It was found by ESR determination that the spin density of the deposited film was $10^{16}$ $cm^{-3}$ or less. Under light irradiation (AM1), the electroconductivity was $4\times10^{-5}$ $Scm^{-1}$, the dark conductivity was $2\times10$ $Scm^{-1}$, and deterioration of the electroconductivity by light was not substantially observed. From scanning electron microscope observation, it was recognized that the film surface was quite flat, and from cross-section observation, no formation of columnar structures in the film was recognized, impurities other than hydrogen were found much less in the film and other than Ar could not be detected. Ar existed in the order of $10^{18}$ $cm^{-3}$. A film of high purity and a very low spin density, i.e., $10^{15}$ $cm^{-3}$ or less, could be obtained even at a considerably low hydrogen concentration.

For comparison, a film was formed in the same manner as in the conventional method by lowering the discharge frequency to 13.56 MHz. It was found that the spin density of the film was $10^{17}$ $cm^{-3}$ or more, and the photoconductivity was low. The film could not be used for use in electronic devices.

EXAMPLE 2

An a-Si film was likewise formed in an apparatus shown in FIG. 1, using p-containing n-type polycrystalline Si having a diameter of 150 mm, a thickness of 2 mm and a volume resistivity of 0.2 $\Omega$cm as a target, and a mixed gas of Ar and hydrogen as an electric discharge gas. A completely defatted, dried Al plate was used as a substrate. The substrate was fixed onto a substrate susceptor in a film-forming chamber, and the film-forming chamber was evacuated to a vacuum of $10^{-8}$ Torr or less and then heated to a substrate surface temperature of 250° C. by a heater in the susceptor. Then, only Ar was passed into the film-forming chamber to set the internal pressure to 10 mTorr, and electric discharge was carried out with an electric discharge power of 5 W under a target bias of $-5$ V, a substrate bias of $+5$ V to clean the substrate surface by ion bombardment. The discharge frequency was 100 MHz. Then, a mixed gas of Ar and hydrogen was continuously passed into the film-forming chamber without breaking the vacuum to deposit a-Si on the cleaned substrate at a substrate temperature of 250° C. The discharge frequency was set to 100 MHz, the target bias to $-150$ V, the substrate bias to $+20$ V, and the discharge power to 100 W. The discharge pressure of the mixed gas of Ar and hydrogen was set to 10 mTorr and the hydrogen partial pressure to 0.1 mTorr. The film was deposited onto the Al substrate at a deposition rate of about 2Å/sec in this apparatus. X-ray diffraction analysis of the thus obtained deposited film showed a halo pattern and neither ring pattern nor spot pattern of crystal was observed at all. From this fact it was confirmed that the deposited film was in an amorphous structure. Cross-sectional observation revealed that there were no columnar structures as often observed in the film deposited by the conventional sputtering method and a compact film was formed.

The hydrogen concentration of the deposited film by infrared absorption spectrum analysis was revealed to be about 10 atomic % without any absorption due to $SiH_2$ or $SiH_3$ bond at about 2090 to about 2150 $cm^{-1}$ at all. Electroconductivity of the film found to be $8\times10^{-2}$ $\Omega$cm and the Ar concentration of the film was found to be in the of $10^{18}$ $cm^{-3}$.

EXAMPLE 3

An a-Si film was formed in an apparatus shown in FIG. 1, using a monocrystal Si wafer having a diameter of 150 mm, a thickness of 2 mm and a volume resistivity of 1,500 $\Omega$cm as a target, and a mixed gas of Ar and hydrogen having an $H_2O$ dew point of $-99.6°$ C. or less as an electric discharge gas. The back side of the target was subjected to B ion implantation by an ion implantation unit in advance to obtain an ohmic contact with a bias electrode. A completely defatted, dried Corning #7059 glass was used as a substrate. The substrate was fixed onto a substrate susceptor in a film-forming chamber, and the film-forming chamber was evacuated to a vacuum of $10^{-8}$ Torr or less and then heated to a substrate surface temperature of 280° C. by a heater in the susceptor. Then, only Ar having the same dew point as above was passed into the film-forming chamber to set the internal pressure to 10 mTorr, and electric discharge was carried out with an electric discharge power of 5 W under a target bias of −5 V, a substrate bias of +5 V to clean the substrate surface by ion bombardment. The discharge frequency was 100 MHz. Then, a mixed gas of Ar and hydrogen was continuously passed into the film-forming chamber without breaking the vacuum to deposit a-Si on the cleaned substrate at a substrate temperature of 280° C. The discharge frequency was set to 100 MHz, the target bias to −150 V, the substrate bias to +12 V by self-bias, and the discharge power to 100 W. The discharge pressure of the mixed gas of Ar and hydrogen was set to 10 mTorr and the hydrogen partial pressure to 0.1 mTorr. The film was deposited onto the #7059 glass substrate at a deposition rate of about 2Å/sec in this apparatus in the substantially same manner as in Example 1. X-ray diffraction analysis of the thus obtained deposited film showed a halo pattern and neither ring pattern nor spot pattern of crystal was observed at all. From this fact it was confirmed that the deposited film was in an amorphous structure.

The hydrogen concentration of the deposited film by infrared absorption spectrum analysis was revealed to be about 5.5 atomic % without any absorption due to $SiH_2$ or $SiH_3$ bond at about 2090 to about 2150 $cm^{-1}$ at all. It was found by ESR determination that the spin density of the deposited film was $10^{15}$ $cm^{-3}$ or less. Under light irradiation (AM1), the electroconductivity was $1 \times 10^{-5}$ $Scm^{-1}$, the dark conductivity was $1 \times 10^{-10}$ $Scm^{-1}$, and deterioration of the electroconductivity by light was not substantially observed. From scanning electron microscope observation, it was recognized that the film surface was quite flat, and from cross-section observation, no formation of columnar structures in the film was recognized. Impurities other than hydrogen were found much less in the film and other than Ar could not be detected. The Ar concentration was about $3 \times 10^{19}$ $cm^{-3}$.

An a-Si film having similar characteristics to those on the #7059 glass substrate was obtained when deposition was carried out under the same conditions as above except a quartz substrate having a thickness of 0.5 mm was used in place of the #7059 glass substrate.

EXAMPLE 4

An a-Si film was likewise formed in an apparatus shown in FIG. 1, using a B-containing p-type monocrystal Si wafer having a volume resistivity of 0.2 Ωcm as a target, and a mixed gas of Ar and hydrogen having a $H_2O$ dew point of −100° C. as an electric discharge gas. An n-type monocrystal Si wafer obtained by dipping in a heated mixture of sulfuric acid and hydrogen peroxide, then removing the mixture, washing with hydrofluoric acid and then with pure water, and complete drying was used as a substrate. The substrate was fixed onto a substrate susceptor in a film-forming chamber, and the film-forming chamber was evacuated to a vacuum of $10^{-8}$ Torr or less and then heated to a substrate surface temperature of 300° C. by a heater in the susceptor. Then, only Ar having the dew point as above was passed into the film-forming chamber to set the internal pressure to 10 mTorr, and electric discharge was carried out with an electric discharge power of 5 W under a target bias of −5 V, a substrate bias of +5 V to clean the substrate surface by ion bombardment. The discharge frequency was 50 MHz. Then, a mixed gas of Ar and hydrogen was continuously passed into the film-forming chamber without breaking the vacuum to deposit a-Si on the cleaned substrate at a substrate temperature of 300° C. The discharge frequency was set to 50 MHz, the target bias to −350 V, the substrate bias to +25 V, and the discharge power to 50 W. The discharge pressure of the mixed gas of Ar and hydrogen was set to 8 mTorr and the hydrogen partial pressure to 0.07 mTorr. The film was deposited onto the Si substrate at a deposition rate of about 4Å/sec in this apparatus. X-ray diffraction analysis of the thus obtained deposited film showed a halo pattern and neither ring pattern nor spot pattern of crystal was observed at all. From this fact it was confirmed that the deposited film was in an amorphous structure.

The hydrogen concentration of the deposited film by infrared absorption spectrum analysis was revealed to be about 7 atomic %. The film was flat and no columnar structures were found. The Ar concentration was found to be as low as $7 \times 10^{18}$ $cm^{-3}$. An a-Si film of good quality was obtained.

EXAMPLE 5

An a-Si film was formed in an apparatus shown in FIG. 1, using polycrystalline SiGe alloy (Ge: 30 atomic %) having a diameter of 150 mm and a thickness of 2 mm as a target, and a mixed gas of Ar and hydrogen having an $H_2O$ dew point of −100° C. as an electric discharge gas. A p-type Si wafer having an electroresistivity of 0.03 Ωcm and a thickness of 0.5 mm, on whose surfaces an oxide film having a thickness of about 400Å, obtained by heat oxidation, was used as a substrate. Washing was carried out in the same manner as in Example 4. The substrate was fixed onto a substrate susceptor in a film-forming chamber, and the film-forming chamber was evacuated to a vacuum of $10^{-9}$ Torr or less and then heated to a substrate surface temperature of 320° C. by a heater in the susceptor. Then, only Ar was passed into the film-forming chamber to set the internal pressure to 15 mTorr, and electric discharge was carried out with an electric discharge power of 5 W under a target bias of −5 V, a substrate bias of +5 V to clean the substrate surface by ion bombardment. The discharge frequency was 200 MHz. Then, a mixed gas of Ar and hydrogen was continuously passed into the film-forming chamber without breaking the vacuum to deposit a-Si at a substrate temperature of 320° C. The discharge frequency was set to 200 MHz, the target bias to −100 V, the substrate bias to +20 V, and the discharge power to 100 W. The discharge pressure of the mixed gas of Ar and hydrogen was set to 15 mTorr and the hydrogen partial pressure to 0.2 mTorr. The film was deposited onto the Si substrate at a deposition rate of about 1.4Å/sec in this apparatus. X-ray diffraction analysis of the thus obtained deposited film showed a halo pattern and neither ring pattern nor spot pattern of crystal was observed at all. From this fact it was confirmed that the deposited film was in an amorphous structure.

The hydrogen concentration of the deposited film by infrared absorption spectrum analysis was revealed to be about 6 atomic % without any absorption due to $SiH_2$ or $SiH_3$ bond at about 2090 to about 2150 $cm^{-1}$ at all. Absorption due to stretching vibration of Ge-H at about 1900 $cm^{-1}$ was observed and it was confirmed that H was attached also to Ge. It was found by ESR determination that the spin density of the deposited film was about $7 \times 10^{15}$ $cm^{-3}$. From scanning electron microscope observation, it was recognized that the film surface was quite flat, and from cross-section observation, no formation of columnar structures in the film was recognized. Ar existed in the order of $10^{18}$ cm$^{-3}$ and the band gap was about 1.48 eV.

EXAMPLE 6

An a-Si film was found in an apparatus shown in FIG. 1, using a monocrystal FZ Si wafer having a diameter of 120 mm, a thickness of 1 mm and a volume resistivity of 1,500 Ωcm as a target, and a mixed gas of Xe and hydrogen having an H$_2$O dew point of −99.6° C. or less as an electric discharge gas. Since the electric resistance of the target was so high that a target bias was hard to obtain, the back side of the target was subjected to B ion implantation by an ion implantation unit to obtain an ohmic contact with a bias electrode. An Si wafer with an oxide films having a thickness of 400Å formed on the surfaces by heat oxidation was used as a substrate. The substrate was fixed onto a substrate susceptor in a film-forming chamber, and the film-forming chamber was evacuated to a vacuum of $10^{-9}$ Torr or less and then heated to a substrate surface temperature of 300° C. by a heater in the susceptor. Then only Xe was passed into the film-forming chamber to set the internal pressure to 15 mTorr, and electric discharge was carried out With an electric discharge power of 5 W under a target bias of −5 V, a substrate bias of +5 V to clean the substrate surface by ion bombardment. The discharge frequency was 100 MHz. Then, a mixed gas of Xe and hydrogen was continuously passed into the film-forming chamber without breaking the vacuum to deposit a-Si on the cleaned substrate at a substrate temperature of 300° C. The discharge frequency was set to 75 MHz, the target bias to −300 V, the substrate bias to +20 V, and the discharge power to 100 W. The discharge pressure of the mixed gas of Xe and hydrogen was set to 15 mTorr and the hydrogen partial pressure to 0.1 mTorr. The film was deposited onto the Si substrate at a deposition rate of about 6Å/sec in this apparatus. X-ray diffraction analysis of the thus obtained deposited film showed a halo pattern and neither ring pattern nor spot pattern of crystal was observed at all. From this fact it was confirmed that the deposited film was in an amorphous structure.

The hydrogen concentration of the deposited film by infrared absorption spectrum analysis was revealed to be about 7 atomic % without any absorption due to SiH$_2$ or SiH$_3$ bond at about 2090 to about 2150 cm$^{-1}$ at all. It was found by ESR determination that the spin density of the deposited film was $10^{16}$ cm$^{-3}$ or less. Under light irradiation (AM1), the electroconductivity was $1\times10^{-5}$ Scm$^{-1}$, the dark conductivity was $8\times10^{-11}$ Scm$^{-}$, and deterioration of the electroconductivity by light was not substantially observed. From scanning electron microscope observation, it was recognized that the film surface was quite flat, and from cross-section observation, no formation of columnar structures in the film was recognized. Impurities other than hydrogen were found much less in the film and other than Xe could not be detected. Xe existed in the order of $10^{19}$ cm$^{-3}$.

As described above, according to the present invention, a hydrogenated a-Si film of good quality with a very low Ar concentration can be formed without using an expensive, hazardous gas.

According to the present process, the obtained film has less SiH$_2$ bond and less contamination of Ar atoms, as compared with the film obtained by the conventional reactive sputtering using a high frequency of about 13.56 MHz. Furthermore, an a-Si film having a uniform film structure free from columnar structures, a high doping efficiency on pn control of electroconductance by impurity doping and a high electroconductivity σp under light irradiation can be obtained.

What is claimed is:

1. A process for forming a hydrogenated amorphous silicon film having a hydrogen content of no greater than 5.5 atomic % and a spin density of no greater than $10^{16}$ cm$^{-3}$ on a substrate disposed in a film-forming chamber, which comprises:

applying a DC or high frequency bias voltage to a target formed of a material comprising silicon atoms and applying a positive DC bias voltage to the substrate to generate a discharge with a discharge frequency of at least 50 MHz in an inert gas atmosphere having a partial pressure of hydrogen no greater than 1 mTorr, wherein the temperature of the substrate is maintained at no greater than 300° C.

2. A process according to claim 1, wherein a partial pressure of other gases than the inert gas containing hydrogen is $10^{-8}$ Torr or less.

3. The process according to claim 1, wherein the discharge is generated at a discharge pressure of $10^{-4}$ Torr to $10^{-2}$ Torr.

4. The process according to claim 1, wherein the inert gas is at least one selected from the group consisting of He, Ne, Ar, Xe and Kr.

5. The process according to claim 1, wherein the target comprises at least one element selected from the group consisting of P, As, Sb, B, Al, Ga, Li, Bi, C, Ge, N, O and Sn.

6. The process according to claim 1, wherein a back pressure of the film-forming chamber is $10^{-6}$ Torr or less.

7. The process according to claim 1, wherein the DC bias voltage applied to the substrate is from +5 V to +20 V.

* * * * *

UNITED STATES PATENT AND TRADEMARK OFFICE
CERTIFICATE OF CORRECTION

PATENT NO. : 5,723,034

DATED : March 3, 1998

INVENTOR(S) : KAZUAKI OHMI

It is certified that error appears in the above-identified patent and that said Letters Patent is hereby corrected as shown below:

On title page,
AT [56] REFERENCES CITED

OTHER PUBLICATIONS

After T. Ohmi et al.: "pp. 4526-4766" should read --pp. 4756-4766--.

COLUMN 1

Line 11, "an" should be deleted;
    Line 12, "amorphous silicon hydride" should be deleted;
    Line 44, "(At)" should read --(Ar)--; and
    Line 57, "method" should read --methods--.

COLUMN 3

Line 24, "so called" should read --so-called--;
    Line 31, "have" should read --have been--; and
    Line 53, "undergo" should read --undergoes--.

COLUMN 4

Line 5, "ion's" should read --ions--; and
    Line 21, "atom," should read --atoms,--.

COLUMN 5

Line 22, "are" should read --is--; and
    Line 55, "reproductibility" should read --reproducibility--.

COLUMN 6

Line 49, "referring" should read --referring to--.

UNITED STATES PATENT AND TRADEMARK OFFICE
CERTIFICATE OF CORRECTION

PATENT NO. : 5,723,034
DATED : March 3, 1998
INVENTOR(S) : KAZUAKI OHMI

It is certified that error appears in the above-identified patent and that said Letters Patent is hereby corrected as shown below:

COLUMN 7

Line 44, "aims" should read --the aims--;
    Line 52, "important" should read --the important--; and
    Line 59, "possible," should read --possible--.

COLUMN 8

Line 2, "Detail" should read --Details--; and
    Line 13, "insatisfactory" should read --unsatisfactory--.

COLUMN 10

Line 6, "follows." should read --follow.--;
    Line 33, "so called" should read --so-called--;
    Line 35, "Particularly to" should read --Particularly, in--; and
    Line 58, "purposes" should read --purposes,--.

COLUMN 12

Line 31, "establish," should read --to establish,--.

COLUMN 13

Line 32, "films" should read --film--.

COLUMN 14

Line 56, "found" should read --was found--; and
    Line 57, "in the" should read --in the vicinity--.

UNITED STATES PATENT AND TRADEMARK OFFICE
CERTIFICATE OF CORRECTION

PATENT NO. : 5,723,034

DATED : March 3, 1998

INVENTOR(S) : KAZUAKI OHMI

It is certified that error appears in the above-identified patent and that said Letters Patent is hereby corrected as shown below:

COLUMN 17

Line 8, "found" should read --formed--;
Line 17, "films" should read --film--;
Line 25, "With" should read --with--; and
Line 50, "$8 \times 10^{-11}$ Scm⁻," should read --$8 \times 10^{-11}$ Scm$^{-1}$,--.

COLUMN 18

Line 18, "σp" should read --$\sigma_p$--.

Signed and Sealed this

Sixth Day of October, 1998

BRUCE LEHMAN

*Attesting Officer*    Commissioner of Patents and Trademarks